(12) United States Patent
Hann et al.

(10) Patent No.: US 11,965,245 B2
(45) Date of Patent: Apr. 23, 2024

(54) METHOD OF PRODUCING AN ALUMINA DISPERSIBLE AT A PH GREATER THAN 8

(71) Applicant: Sasol (USA) Corporation, Houston, TX (US)

(72) Inventors: Allison L. Hann, DeQuincy, LA (US); Brian C. Peoples, Lake Charles, LA (US)

(*) Notice: Subject to any disclaimer, the term of this patent is extended or adjusted under 35 U.S.C. 154(b) by 0 days.

(21) Appl. No.: 17/939,732

(22) Filed: Sep. 7, 2022

(65) Prior Publication Data

US 2023/0166977 A1 Jun. 1, 2023

Related U.S. Application Data

(62) Division of application No. 16/322,772, filed as application No. PCT/US2017/064598 on Dec. 5, 2017, now Pat. No. 11,512,004.

(60) Provisional application No. 62/380,770, filed on Aug. 29, 2016.

(51) Int. Cl.
*C01F 7/026* (2022.01)
*C01F 7/141* (2022.01)
*C23C 16/455* (2006.01)

(52) U.S. Cl.
CPC ........ *C23C 16/45574* (2013.01); *C01F 7/026* (2013.01); *C01F 7/141* (2013.01); *C23C 16/45544* (2013.01); *C23C 16/45565* (2013.01); *C01P 2002/60* (2013.01); *C01P 2006/22* (2013.01)

(58) Field of Classification Search
CPC .................. C01F 7/141; C01F 7/026
See application file for complete search history.

(56) References Cited

U.S. PATENT DOCUMENTS

| | | | |
|---|---|---|---|
| 3,207,578 A | 9/1965 | Brown et al. | |
| 4,676,928 A | 6/1987 | Leach et al. | |
| 6,312,619 B1 | 11/2001 | Pope et al. | |
| 2009/0036299 A1 | 2/2009 | Kodama et al. | |

FOREIGN PATENT DOCUMENTS

| | | | |
|---|---|---|---|
| JP | 08259225 | 10/1996 | |
| JP | 08325010 | 12/1996 | |
| WO | 2005115917 | 12/2005 | |
| WO | WO-2012068163 A1 * | 5/2012 | ............ B01J 23/745 |

OTHER PUBLICATIONS

Shin, Y. J. et al., "Dispersion of aqueous nano-sized alumina suspensions using cationic polyelectrolyte", Mat. Res Bulletin. vol 41, No. 10, 2006 (pp. 1964-1971).

(Continued)

*Primary Examiner* — James A Fiorito
(74) *Attorney, Agent, or Firm* — Werner IP Law, P.C.

(57) ABSTRACT

A method of making an alumina including providing an alumina slurry, aging the slurry, adding a tricarboxylic acid to the aged alumina slurry, further aging the slurry, and spray drying, the method being characterized by the addition of a dicarboxylic acid either at the same time as the tricarboxylic acid, or after the second aging and before the spray drying. The resulting alumina is dispersible at a pH greater than 9.5 above 95% and has a viscosity below 0.4 Pa·S for 10 wt % sols.

6 Claims, 1 Drawing Sheet

(56) References Cited

OTHER PUBLICATIONS

Sasol Germany, et al. "DISPERAL/DISPAL High Purity Dispersible Aluminas", 2003, retrieved from http://www.sasoltechdata.com/tds/DISPERAL_DISPAL.pdf, retrieved Feb. 1, 2019.
Xie, et al., "Experimental Study on the Preparation of Boehmite Sol by Sol-Gel Method" Membrane Science and Technology, vol. 25, issue 4, pp. 71-73, Aug. 31, 2005.

\* cited by examiner

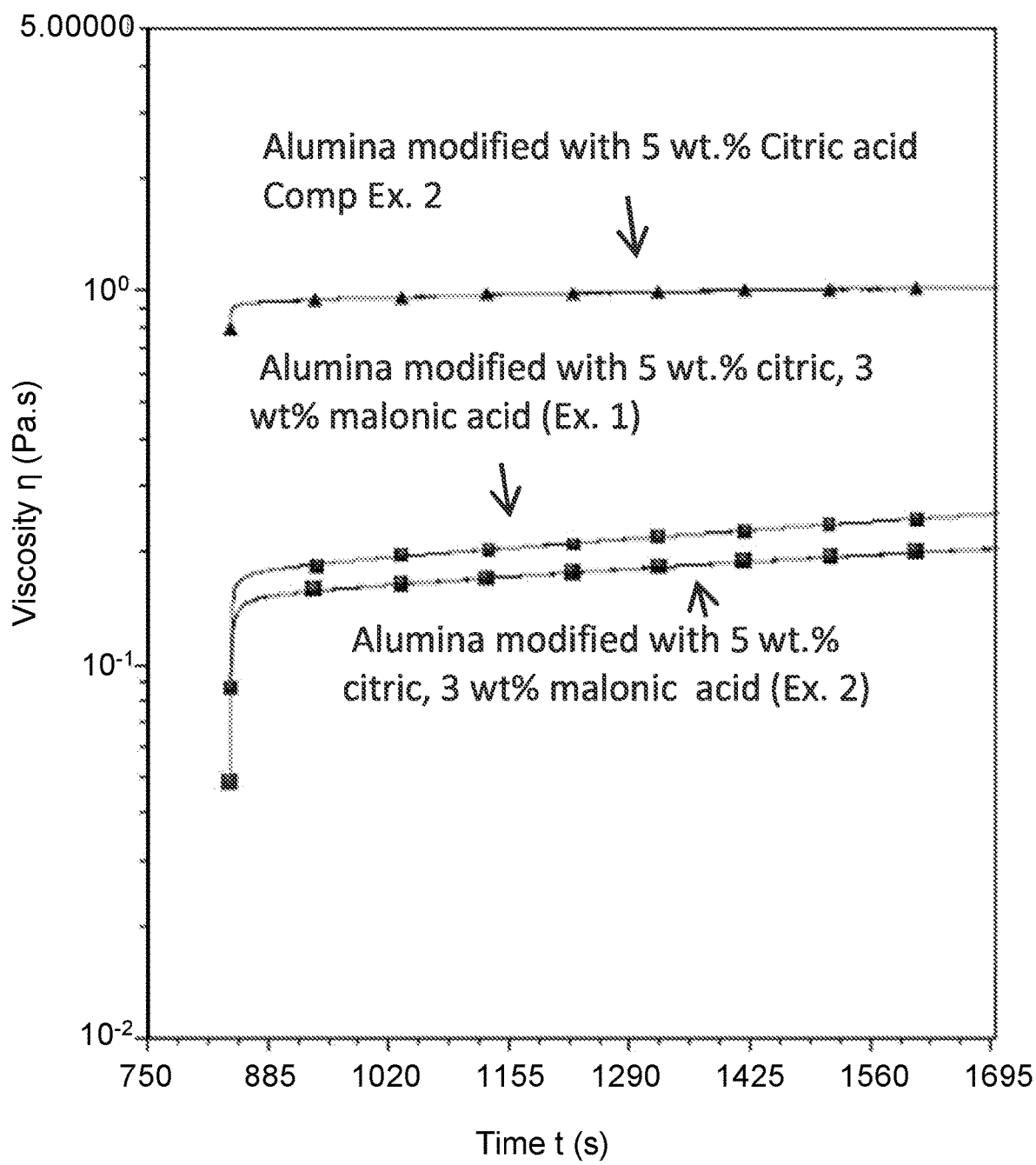

METHOD OF PRODUCING AN ALUMINA DISPERSIBLE AT A PH GREATER THAN 8

CROSS REFERENCE TO RELATED APPLICATION

This application is a divisional of U.S. application Ser. No. 16/322,772, filed Feb. 1, 2019, which is a U.S. national phase application of PCT/US2017/046598, filed Aug. 11, 2017, which claims priority to U.S. Application No. 62/380,770 filed on Aug. 29, 2016, the disclosures of which are incorporated herein by reference for all purposes.

THE INVENTION relates to a novel method of making an alumina that is dispersible at a pH of greater than 8 and to a highly dispersible alumina.

BACKGROUND

Citric acid is well known in the field of highly dispersible aluminas as an effective dispersant for alumina oxides. Generally, citric acid is used as a dispersant at an acidic pH (a pH of below 7), however, commercial products do exist which use citric acid to stabilize alumina dispersed at basic pHs. While citric acid is an effective dispersant a limitation is that at a pH of greater than 7, these citric acid dispersants have a tendency to be quite viscous at reasonable weight loadings (e.g. at 10 wt. % $Al_2O_3$). This limits their use in many applications. To solve this viscosity problem, viscosity modifiers are added to these alumina dispersions. The problem with the addition of these viscosity modifiers is that their introduction to the alumina dispersions, e.g. polyacrylates, may affect the properties of the dispersions as well as the resultant product after drying and calcination.

The inventors have found a solution to this problem.

INVENTION

According to the first aspect of the invention, there is provided a method of making an alumina including the following steps:
i) providing an alumina slurry;
ii) aging the alumina slurry to form an aged alumina slurry including alumina having a crystallite size of from 38 to 450 Å (120 plane);
iii) adding a tricarboxylic acid to the aged alumina slurry to form an acid modified slurry;
iv) aging the acid modified slurry at a temperature of between 75° C. and 125° C. to form a product slurry; and
v) spray drying the product slurry,
the method being characterised by the addition of a dicarboxylic acid either in step iii) of the process with the tricarboxylic acid or by adding the dicarboxylic acid to the product slurry after step iv), before spray drying in step v).

The alumina produced by the process of the invention is disperseable at a pH of greater than 8, preferably greater than 9 and most preferably greater than 9.5.

The alumina slurry includes aluminum oxyhydroxide, aluminum oxide, aluminum hydroxide, or mixtures thereof. The alumina slurry preferably includes Boehmite, Bayerite, Gibbsite, gamma-alumina, transitional (delta-theta) aluminas and mixtures thereof. More preferably, the alumina slurry includes Boehmite and gamma-aluminas, and most preferably includes Boehmite.

An alumina slurry can be produced in a number of ways. The alumina slurry can be produced via the hydrolysis of aluminum alkoxides in water, through the precipitation of alumina salts in at least water, or through the suspension of an aluminum compound in at least water. It is preferred to provide an alumina slurry made via the hydrolysis of an aluminum alkoxide (for example boehmite) in water. Depending on the production route, the alumina slurry has a pH of 6-10.

The alumina slurry is aged by heating to a temperature of 95-220° C. for a period of from 30 minutes to 8 hours. After aging, the alumina slurry preferably includes alumina having a crystallite size of from 40 to 180 Å (120 plane), more preferably the aged alumina slurry includes an alumina having a crystallite size of from 60 to 140 Å (120 plane), and most preferably a crystallite size of from 80 to 100 Å (120 plane).

The tricarboxylic acid may be added either as a solution or as a powder. The tricarboxylic acid includes citric acid, isocitric acid, aconitic acid, tricarballylic acid, trimesic acid and derivatives thereof, preferably the tricarboxylic acid includes citric acid, trimesic acid, and aconitic acid, and most preferably the tricarboxylic acid includes citric acid. The invention provides for the use of derivatives of tricarboxylic acids, in particular sodium and ammonium salts thereof. The derivatives of the tricarboxylic salts include sodium citrates (mono, di, and tri sodium citrate) and ammonium citrates (mono, di, and triammonium citrate). Mixtures of tricarboxylic acids may also be used.

The addition of the tricarboxylic acid (either alone or with the dicarboxylic acid), to the alumina slurry reduces the pH to a pH of 1 to 6, hence the alumina slurry becomes an acid modified slurry.

The acid modified slurry is aged for a time period of between 10 minutes to one hour. A more preferred temperature range for aging the acid modified slurry is a temperature of preferably between 85° C. and 115° C., most preferably the acid modified slurry is aged at a temperature of 95° C. to 105° C.

The dicarboxylic acid includes malonic acid, succinic acid, gluatric acid, adipic acid, pimelic acid, maleic acid, fumaric acid, glutaconic acid, muconic acid, citraconic acid, mesaconic acid, and mixtures thereof. Preferably the dicarboxylic acid includes malonic acid, citraconic acid, mesaconic acid, fumaric acid, maleic acid, succinic acid and mixtures thereof. Most preferably the dicarboxylic acid includes malonic acid.

The percentage of alumina in the alumina slurry of step i) is between 1 and 15 wt. % $Al_2O_3$, and preferably between 5 and 10 wt. % $Al_2O_3$.

On an $Al_2O_{basis}$ the total amount of acid (tricarboxylic and dicarboxylic acid) added in step iii) and/or after step iv) of the process of the invention is between 0.5 and 15 wt. %, preferably between 2 and 11 wt. %, and most preferably between 4 and 9 wt. % of the acid modified slurry or product slurry depending on when the dicarboxylic acid is added.

The advantage of the present invention is that both acids can be added and reacted with the alumina in the initial processing and therefore this eliminates the need for a viscosity modifier.

The aging of the alumina in the presence of the tricarboxylic acid is advantageous as it increases dispersibility and the stability of the material over time.

The dicarboxylic acid can either be added at the same time as the tricarboxylic acid by premixing the acids or by the sequential addition of the acids, before aging, or after aging of the product slurry. Both methods produce materials with similar properties. If the dicarboxylic acid is added at the same time as the tricarboxylic acid, then it is preferred to premix the acids.

According to a second aspect of the invention there is provided a highly dispersible alumina at a pH of greater than 8 having a dispersibility above 90% and a viscosity below 5 Pa·S for 10 wt. % sols.

Preferably, the viscosity of the highly dispersible alumina at a pH of greater than 8 has a dispersibility above 90% and a viscosity below 1 Pa·S for 10 wt. % sols.

Preferably, the highly dispersible alumina has a dispersibility at a pH greater than 9.5 above 95% and a viscosity below 0.4 Pa·S for 10 wt. % sols.

The viscosity of the highly dispersible alumina was measured as per the method described under the Examples section.

Broad Description

According to the first aspect of the invention, there is provided a method of making an alumina dispersible at a pH of greater than 8, more preferably dispersible at a pH greater than 9, and most preferably dispersible at a pH greater than 9.5. The method includes providing an alumina slurry for example a Boehmite slurry (made by the hydrolysis of boehmite in water) and hydrothermally aging the slurry at a temperature of 95 to 220° C. for a period of from about 30 minutes to 8 hours to form an aged alumina slurry of a desired crystallite size, typically being from 40 to 180 Å (120 plane), more preferably from 60 to 140 Å (120 plane), most preferably the aged alumina slurry includes an alumina having a crystallite size of from 80 to 100 Å (120 plane).

The alumina slurry will have a pH of 6-10.

The crystallite size is determined by analyzing the dried powder by x-ray diffraction (XRD). The 120-plane peak height, full-width-at-half-maximum-intensity (FWHM), and angle are obtained from the XRD spectra. This information is inputted into the Scherrer equation for determining crystallite sizes. Other information on the specific instrument including line broadening and x-ray wavelength are also inputted. Solving the equation results in a size for the crystal plane that was measured. This is well known in the field of the invention.

In an embodiment of the invention tricarboxylic acid, for example citric acid, and dicarboxylic acid, for example malonic acid, are pre-dispersed (pre-mixed) in water and added to the aged alumina slurry to form an acid modified slurry. The acids can also be added sequentially to the aged alumina slurry to form the acid modified slurry. After the addition of the acid(s) the alumina slurry will have a pH of 1 to 6 and is therefore termed an acid modified slurry.

The acid modified slurry is then aged for a period of between 10 min and an hour. The temperature ranges for this aging process are from 75° C. to 125° C., more preferably 85° C. to 115° C., and most preferably the acidic modified slurry is aged at a temperature of 95° C. to 105° C. to form a product slurry.

As an alternative, the method may include the addition of the dicarboxylic acid, i.e. malonic acid, to the product slurry after it has been aged and before it is spray dried and not together with the tricarboxylic acid, i.e. the citric acid. Materials having similar properties will be produced using both methods.

The product slurry is then spray dried and collected.

The method produces an alumina comprising the following characteristics; a dispersibility at a pH greater than 8 above 90% and a viscosity below 5 Pa·S for 10 wt. % sols.

Preferably, the highly dispersible alumina at a pH of greater than 8 has a dispersibility above 90% and a viscosity below 1 Pa·S for 10 wt. % sols.

More preferably, the alumina has a dispersibility at a pH greater than 9.5 above 95% and a viscosity below 0.4 Pa·S for 10 wt. % sols.

EXAMPLES

The invention will now be described by way of non-limiting examples and a FIGURE, where:

FIG. 1 shows the viscosities of alumina dispersions at 5 and 10 wt % as per Examples 1 and 2, respectively, and Comparative Example 2 demonstrating the effect that dicarboxylic acid addition as per the invention has on the viscosity of the product slurry.

Dispersibility is measured by first producing an alumina dispersion at the indicated pH. This is done by adding 10 wt. % alumina to an aqueous solution of ammonium hydroxide (having a pH of 10). The pH is adjusted using a concentrated solution of ammonium hydroxide. The dispersion is stirred for 30 minutes. The dispersion is then centrifuged for 30 minutes following which the supernatant is decanted off. Any residual powder is dried at 120° C. and massed. The dispersibility is calculated by subtracting the mass of the residue after drying from the mass of the powder added, and then dividing by the mass of the powder added and finally multiplying the result by 100.

Viscosity is measured by first producing an alumina dispersion at the indicated pH and a solids loading of 10 wt. % This is accomplished by adding the alumina to an aqueous solution of ammonium hydroxide and adjusting the pH using ammonium hydroxide as required. The resulting slurry is then stirred for 30 minutes. A small amount of slurry is then transferred to the base plate of a TA instruments DHR2 rheometer which is temperature equilibrated at 25° C.

The 40 mm flat plate geometry is lowered to the requisite gap and any slurry pushed from the gap trimmed. If the slurry added is insufficient to completely fill the area under the plate, the plate is raised and additional slurry added. The instrument is initiated with a shear rate of 100 s$^{-1}$ and the viscosity recorded.

Example 1—Preparation of a Malonic/Citric Acid Modified Alumina

A Boehmite slurry was produced via the hydrolysis of aluminum alkoxides and hydrothermally aged for 2 hours at 120° C. to obtain an alumina having a crystallite size of 95 Å (120 crystallite plane). 5 wt. % citric acid and 3 wt. % malonic acid (weight percentage on the basis of alumina content) were premixed in water and then added to the boehmite slurry to form an acid modified slurry. The acid modified slurry was aged for 1 hour at 105° C. to form a product slurry and the product slurry was then spray dried and product collected.

Example 2—Preparation of a Citric Acid Modified Alumina, Post Modified with Malonic Acid A Boehmite slurry was produced via the hydrolysis of aluminum alkoxides and hydrothermally aged for 2 hours at 120° C. to obtain an alumina having a crystallite size of 95 Å (120 crystallite plane). 5 wt. % citric acid (weight percentage on the basis of alumina content) was added to the boehmite slurry to form an acid modified slurry. The acid modified slurry was then aged at 105° C. for 1 hour to form a product slurry. The product slurry was then modified by the addition of 3 wt. % malonic acid and stirred for 30 min. The modified product slurry was then spray dried and product collected.

Comparative Example 1—Example 1 without the Aging Step iv)

A Boehmite slurry was provided as per Example 1 and hydrothermally aged to obtain an alumina having a crystallite size of 95 Å (120 crystallite plane). 5 wt. % citric acid and 3 wt. % malonic acid (weight percentage on the basis of alumina content) were premixed in water and added to the boehmite slurry to form an acid modified slurry. The acid modified slurry was then spray dried and the product collected.

Comparative Example 2—Preparation of a Citric Acid Modified Alumina

A Boehmite slurry was provided as per Example 1 and hydrothermally aged to obtain an alumina having a crystallite size of 95 Å (120 crystallite plane). 5 wt. % citric acid (weight percentage on the basis of alumina content) in water was added to the boehmite slurry to form an acid modified slurry. The acid modified slurry was aged for 1 hour at 105° C. and then spray dried and the product collected.

Comparative Example 3—Example 2 with the Malonic Acid Aged with the Alumina and Citric Acid Added Post-Aging A Boehmite slurry was provided as per Example 1 and hydrothermally aged to obtain an alumina having a crystallite size of 95 Å (120 crystallite plane). 3 wt. % malonic acid (weight percentage on the basis of alumina content) was added and the boehmite slurry which was then aged at 105° C. for 1 hour. The slurry was then modified by the addition of 5 wt. % citric acid and stirred for 30 min to form a product slurry. The product slurry was then spray dried and the product collected.

The results are included in Table 1 hereunder and some illustrated in FIG. 1.

TABLE 1

| Sample | Dispersibility @ pH 10 | Viscosity of 10% sol at pH 10 (30 min) |
| --- | --- | --- |
| Example 1 | 97.5% | 0.156 Pa · S |
| Example 2 | 98% | 0.180 Pa · S |
| Comparative Example 1 | Gelled | Gelled |
| Comparative Example 2 | 95.5% | 1.3 Pa · S |
| Comparative Example 3 | Gelled | Gelled |

As illustrated by the results in Table 1, citric acid modified boehmites (Comparative Example 2) are indeed highly dispersible, however the viscosity of the materials, 1.3 Pa·S, is too high for use in many potential applications. The co-addition of malonic acid with the citric acid to the slurry before hydrothermal aging (Example 1) produces a material with slightly higher dispersibility (97.5%) and a much lower viscosity (0.156 Pa·S). This is sufficiently fluid to be used in many applications. Alternatively, the malonic acid can be added to the alumina slurry after it has been aged with the citric acid (Example 2), without any negative effects compared to Example 1. In fact the materials produced are nearly identical with respect to dispersibility and viscosity.

The order of addition and aging of these materials is an important step in the production of a highly dispersible material capable of producing low viscosity high pH sols. In the case where the alumina is not aged in the presence of the acids (Comparative Example 1) the material gels and does not produce a dispersion. When the malonic acid alone is aged with the alumina, and the citric acid added post-aging (Comparative Example 3) the material also gels when dispersed at a pH of 10.

FIG. 1, further shows the difference in sol viscosity for a dispersion produced at 10 wt % and pH 10 using the samples produced in Examples 1 and 2 compared to Comparative Example 2 under the same conditions. The samples prepared using both malonic and citric acids have sol viscosities substantially lower than that of the sample produced using citric acid alone. After 30 minutes the viscosity of the sol produced using the material from Example 1 has a viscosity of 0.156 Pa·S, while that from Example 2 a viscosity of 0.180 Pa·S, both of which are substantially lower than that of the sol prepared from the material in Comparative Example 2, which had a viscosity of 1.3 Pa·S.

The invention claimed is:

1. An acid-modified alumina comprising: an alumina modified with a tricarboxylic acid and a dicarboxylic acid to form the acid-modified alumina, the acid-modified alumina being highly dispersible in an aqueous solution at a pH of greater than 8, the acid-modified alumina having a dispersibility above 90% and a viscosity below 5 Pa·S for 10 wt. % sols in the aqueous solution.

2. The acid-modified alumina of claim 1 wherein the alumina is boehmite.

3. The acid-modified alumina of claim 1 having a viscosity below 1 Pa·S for 10 wt. % sols.

4. The acid-modified alumina of claim 3 wherein the alumina is boehmite.

5. The acid-modified alumina of claim 1 which when dispersed in an aqueous solution at a pH of greater than 9.5 has a dispersibility above 95% and a viscosity below 0.4 Pa·S for 10 wt. % sols in the aqueous solution.

6. The acid-modified alumina of claim 5 wherein the alumina is boehmite.

* * * * *